United States Patent

Shinmura

[11] Patent Number: 6,060,371
[45] Date of Patent: May 9, 2000

[54] PROCESS FOR FORMING A TRENCH DEVICE ISOLATION REGION ON A SEMICONDUCTOR SUBSTRATE

[75] Inventor: Naoyuki Shinmura, Tenri, Japan

[73] Assignee: Sharp Kabushiki Kaisha, Osaka, Japan

[21] Appl. No.: 09/114,498

[22] Filed: Jul. 13, 1998

[30] Foreign Application Priority Data

Aug. 22, 1997 [JP] Japan ..................... 9-225904

[51] Int. Cl.[7] .................................. H01L 21/76
[52] U.S. Cl. ............................. 438/424; 438/221
[58] Field of Search .................. 438/424, 425, 438/427, 435, 211, 221

[56] References Cited

U.S. PATENT DOCUMENTS 5,753,561  5/1998  Lee et al. ...................... 438/424
5,811,347  9/1998  Gardner et al. .................. 438/435

FOREIGN PATENT DOCUMENTS 7-235590  of 0000  Japan .

*Primary Examiner*—Olik Chaudhuri
*Assistant Examiner*—Anh Duy Mai
*Attorney, Agent, or Firm*—Nixon & Vanderhye, P.C.

[57] ABSTRACT

A process for manufacturing a semiconductor device including: forming a mask having a pattern for forming a trench on a semiconductor substrate; forming a film having substantially the same etch rate as the semiconductor substrate on the resulting semiconductor substrate; forming a trench having an inclined sidewall by simultaneously etching the film and a trench formation region on the semiconductor substrate; and embedding an insulating material in the trench thereby to form a device isolation region.

5 Claims, 3 Drawing Sheets

PROCESS FOR FORMING A TRENCH DEVICE ISOLATION REGION ON A SEMICONDUCTOR SUBSTRATE

CROSS-REFERENCE TO RELATED APPLICATION

This application is related to Japanese patent application No. HEI 9(1997)-225904, filed on Aug. 22, 1997, whose priority is claimed under 35 USC § 119, the disclosure of which is incorporated by reference in its entirety.

BACKGROUND OF THE INVENTION

1. Field of the Invention

The present invention relates to a process for manufacturing a semiconductor device. More particularly, the invention relates to a process for forming a device isolation region to electrically isolate a semiconductor device formed on a semiconductor substrate.

2. Description of Related Art

A selective oxidation device isolation method and a trench device isolation method are known methods for forming a device isolation region to electrically isolate a device on a surface of a semiconductor substrate. In the selective oxidation device isolation method, a silicon substrate is selectively oxidized using a patterned silicon nitride film as a mask to form the device isolation region. In the trench device isolation method, on the other hand, trench (groove) is formed on the surface of a silicon substrate by dry-etching and the trench is filled with insulating material such as silicon oxide, to from the device isolation region.

The selective oxidation method is now generally employed in view of its simple procedure, but there is a trend toward the trench device isolation method with miniaturization of the device. In the trench device isolation method, in general, a semiconductor substrate is dry-etched vertically using a gate electrode or a dummy pattern disposed on the substrate as a mask. However, silicon interfaces perpendicular to the surface to the silicon substrate form at an end part of an active region, so that an electric field may be enhanced at the end part and the trench may not be sufficiently filled with the insulating film, which causes a void at the part.

The trench device isolation method applied to a semiconductor device having an interconnection of diffusion layers which cross the device isolation region may cause failure in connection. This is because, when impurity ions are implanted for forming the interconnection of the diffusion layers, impurity ions are insufficiently implanted into a vertical sidewall of the trench.

To solve these problems, a method for forming the device isolation region using a trench having an arc-shaped sidewall is disclosed in Japanese Unexamined Patent Publication No. HEI 7(1995)-235590.

More particularly, as shown in FIG. 3(a), a dummy pattern constituted of a silicon oxide film 24, a polycrystalline silicon film 23 and a silicon oxide film 22 are formed on a silicon semiconductor substrate 21.

Then, as shown in FIG. 3(b), a sidewall spacer 25 of silicon oxide film is formed on a sidewall of the dummy pattern using a mixture gas of $SiCl_4$ and oxygen. Then, as shown in FIG. 3(c), the silicon semiconductor substrate 21 is etched with sputtering the sidewall spacer 25 to form trenches having an arc-shaped sidewall. Thus, the enhancement of the electric field at the sidewall of the trench can be eased. Further, the trench is wider at its upper portion and narrower at its bottom. This configuration facilitates the embedding of insulating material in the bottom portion of the trench 26. This prevents occurrence of a void. Moreover, since the sidewall of the trench 26 is arc-shaped, impurity ions for forming interconnections of diffusion layers can easily be implanted into the sidewall of the trench 26. In FIG. 3(c), the reference numeral 25a denotes the sidewall spacer after the formation of the trench.

However, in the above-described technique disclosed by Japanese Unexamined Patent Publication No. HEI 7(1995)-235590, since the silicon semiconductor substrate is etched with sputtering the sidewall spacer of silicon oxide film, the substrate must be etched at a higher ion energy (an RF bias power of 50 to 150 W) than in the case where an ordinary trench is formed on a silicon substrate by etching. A higher ion energy does cause greater damage to the silicon semiconductor substrate and may more possibly cause silicon crystallographic defects in the silicon semiconductor substrate, which will result in junction leak.

Furthermore, the number of steps is increased by an additional step for forming the sidewall.

SUMMARY OF THE INVENTION

In view of the above-described circumstances, an object of the present invention is to provide a process for forming a device isolation region including a step of forming a trench having an inclined sidewall by etching at such an ion energy that is sufficient for forming a typical trench on a silicon substrate.

The present invention provides a process for manufacturing a semiconductor device comprising the steps of:

forming a mask having a pattern for forming a trench on a semiconductor substrate;

forming a film having substantially the same etch rate as the semiconductor substrate on the resulting semiconductor substrate;

forming a trench having an inclined sidewall by simultaneously etching the film and a trench formation region on the semiconductor substrate; and embedding an insulating material in the trench thereby to form a device isolation region.

BRIEF DESCRIBPTION OF THE DRAWINGS

FIGS. 1(a) to 1(e) are sectional views illustrating steps for forming a device isolation region in accordance with Example 1 of the present invention;

FIGS. 2(a) to 2(e) are sectional views illustrating steps for forming a device isolation region in accordance with Example 2 of the present invention;

FIGS. 3(a) to 3(c) are sectional views illustrating conventional steps for forming a device isolation region.

DESCRIPTION OF THE PREFERRED EMBODIMENTS

Figure 1A:
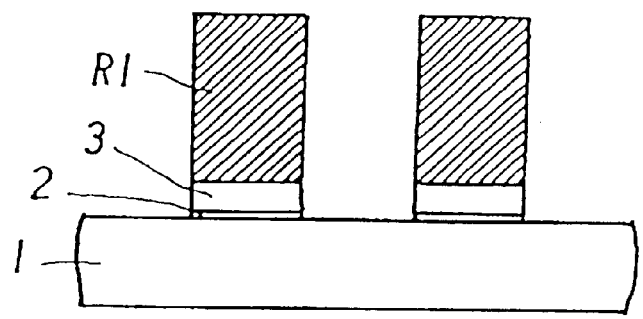

The steps in the process for manufacturing a semiconductor device of the present invention are now described in sequence.

First, the mask having a pattern for forming trenches is formed on the semiconductor substrate.

The semiconductor substrates which can be used in accordance with the present invention are not particularly limited, but may be any substrates that are usable in this field of art, including a silicon substrate and a gallium arsenide substrate, for example. Among these substrates, the silicon substrate is preferably used.

The mask is used as a mask in anisotropic etching for forming the trench as described later. The mask has a pattern including an opening in a region where the trench is desired to be formed. The thickness of the mask and the width of the opening can suitably be set for forming the trench in a desired configuration. Preferably, the mask has a thickness of about 100 nm to about 500 nm and the opening has a width of about 300 nm to about 800 nm. When the mask is too thin or the opening is too small in width, it is difficult to form the trench having a sufficient depth. On the other hand, when the mask is too thick, a longer time is necessary for removing the mask by etching, and deeper the trench is formed, so that it becomes more difficult to embed the insulating material (film) in the trench. When the opening has too large in width, the trench also have a large width, so that it is difficult to reduce the size of the semiconductor device.

The mask may have any constitution so long as it has at least a layer having resistance to anisotropic etching is on the surface of the mask. The mask may be formed of a silicon oxide film, a silicon nitride film, laminate thereof and the like. The laminate includes a two-layer structure of silicon oxide film and silicon nitride film and a three-layer structure of silicon oxide film, silicon nitride film and silicon oxide film. The mask of silicon oxide film and/or silicon nitride film is hereinafter referred to as a dummy mask. An alternative mask may be composed of a gate insulating film, a gate electrode and an insulating film. Here, the gate insulating film may be formed of a silicon oxide film, a silicon nitride film or laminate thereof. The gate electrode may be formed of a silicon film of polycrystalline silicon or amorphous silicon and a metal film of copper or aluminum, for example. Materials for the insulating film are not particularly limited so long as the materials have at least resistance to anisotropic etching. Examples of such materials are a silicon oxide film, a silicon nitride film and laminates thereof. The film constituting the mask may be formed by the conventional method such as the thermal oxidation method, chemical vapor deposition (CVD) method and sputtering method.

The mask may be formed by the conventional photolithography method and etching method. It is noted that both a wet etching and dry etching can be used for the etching. Among these etching methods, the dry etching like reactive ion etching is preferred.

Then, the film having generally the same etch rate as the semiconductor substrate is formed on the resulting semiconductor substrate. The film may be constituted of a silicon film of polycrystalline silicon, amorphous silicon or the like in the case where a silicon substrate is used for the semiconductor substrate.

The film preferably has such a thickness that can cover a step generated by the mask. More particularly, the film preferably has a thickness of about 100 nm to about 400 nm. The film may be formed by the CVD method, for example. The surface of the film has asperities in accordance with asperities on the semiconductor substrate having the mask formed thereon. Particularly, in a portion of the surface of the film corresponding to the opening of the mask, there are formed depressions having the inclined sidewall. Here, the inclined sidewall typically have an arc shape, but may have another shape.

Then, the film and a trench formation region of the semiconductor substrate are simultaneously etched by the anisotropic etching to form trench having the inclined sidewalls. Here, the inclined sidewalls typically have an arc shape, but may have another shape.

According to the present invention, since the film is present, the trench can be formed in the same conditions as in the case of forming trench directly on the substrate. More particularly, when the anisotropic etching is performed using an ECR (electron cyclotron resonance plasma) etching method, the trench can be formed at a microwave power of about 500 W to about 2,000 W and an RF (resonance frequency) power of about 20 W to about 40 W. Etching gases usable for the ECR etching method include a combination of HBr and $O_2$, for example.

The trench formed by the above-described steps preferably has a depth of about 200 nm to about 400 nm. The trench preferably has a width of 0 nm to about 100 nm at its bottom and a width of about 300 nm to about 800 nm at its upper portion.

Then, device isolation region can be formed by filling the trench with insulating material (film) by the CVD method. The insulating material, for example, is made of silicon oxide, silicon nitride or the like.

In the present invention, the semiconductor substrate having device isolation region may further be subjected to the following steps.

After filling the trench with the insulating material, the surface of the device isolation region may be flattened, for example, by a chemical mechanical polishing (CMP) method. The flattening of the surface of the device isolation region will prevent the breaking of a connection formed thereon later.

After flattening the surface of the device isolation region, the resulting semiconductor substrate may be subjected to the following steps in the case where the dummy mask is used. The dummy mask is removed by etching. The semiconductor is exposed where the dummy mask is removed. Then the exposed semiconductor substrate is subjected to a thermal oxidation to form a gate oxide film, and then a material for a gate electrode (e.g., polycrystalline silicon) is deposited on the entire surface of the semiconductor substrate. Subsequently, the material for the gate electrode can be patterned by the conventional etching method to form the gate electrode.

The above-described gate electrode may be used as a floating gate. In this case, a control gate electrodes can be formed on the floating gate with intervention of a gate insulating film in a desired region on the semiconductor substrate. Here, in the case where the mask is comprised of the gate insulating film, the gate electrode and the insulating film, the insulating film is preferably removed at the same time as or by a step different from the flattening of the device isolation region.

It is noted that, in the present invention, source/drain regions and source/drain/gate connection layers can be formed by the conventional.

EXAMPLES

The present invention is now described in detail by way of example with reference to the accompanying drawings, which should not be construed to limit the scope of the invention.

FIGS. 1(a) to 1(e) are sectional views illustrating steps for forming a semiconductor device in accordance with Example 1 of the present invention. FIGS. 2(a) to 2(e) are sectional views illustrating steps for forming a semiconductor device in accordance with Example 2 of the present invention.

Example 1

By reference to FIGS. 1(a) to 1(e), a process sequence for forming a semiconductor device of the present invention is explained.

First, a silicon oxide film 2 was formed on a P-type silicon substrate 1 by the thermal oxidation method. Then, a silicon nitride film 3 was deposited by the CVD (chemical vapor deposition) method. Here, the silicon oxide film 2 was formed to be 20 nm in thickness and the silicon nitride film 3 was deposited to a thickness of 300 nm.

Then, as shown in FIG. 1(a), using a resist R1 patterned by the photolithography method as a mask, portion of the silicon nitride film 3 and the silicon oxide film 2 which a portion was to be a device isolation region completely was removed by the reactive ion etching method.

Figure 1B:
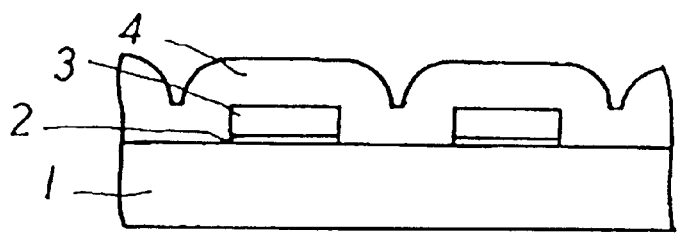

After removing the resist R1, a polycrystalline silicon film 4 having substantially the same etch rate as the silicon substrate 1 was deposited on the entire surface of the resulting substrate 1 by the CVD method as shown in FIG. 1(b). Here, the polycrystalline silicon film 4 was deposited to a thickness of 200 nm.

Figure 1C:
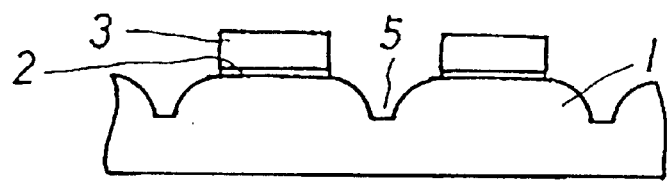

Then, the polycrystalline silicon film 4 was etched by the reactive ion etching method until the polycrystalline silicon film 4 was completely removed. At this time, because the silicon substrate 1 was etched at substantially the same rate as the polycrystalline silicon film 4, a trench 5 having an arch-shaped sidewall was formed in the silicon substrate 1 as shown in FIG. 1(c).

Here, the reactive etching method was performed at a microwave power of 500 W and an RF power of 20 W with an etching gas of HBr (at a flow rate of 40 sccm) and $O_2$ (at a flow rate of 3 sccm), using an ECR etching apparatus of substrate bias type.

Figure 1D:
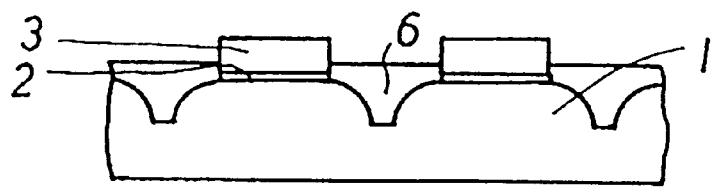

Then, a silicon oxide film of thickness of about 500 nm was deposited on the entire surface of the resulting substrate by the CVD method. Subsequently, the deposited oxide film was flattened by the CMP method. Thus, as shown in FIG. 1(d), the trench 5 was filled with the silicon oxide material (film) 6 to form the device isolation region.

Figure 1E:
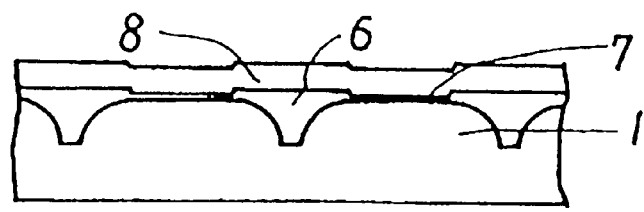

Then, after the silicon nitride film 3 and the silicon oxide film 2 were removed, the surface of the resulting silicon substrate 1 was subjected to the thermal oxidation method to form a gate oxide film 7. Then, as shown in FIG. 1(e), a polycrystalline silicon film 8 as a material for a gate electrode was formed on the entire surface of the resulting substrate by the CVD method. Subsequently, a resist (not shown) patterned for forming the gate electrode was formed on the polycrystalline silicon film 8, which was then patterned using the resist as a mask to form the gate electrode.

Example 2

By reference to FIGS. 2(a) to 2(e), explained is a process sequence for forming a device isolation region in accordance with Example 2 of the present invention.

First, a silicon oxide film 9 was formed on a P-type silicon substrate 1 by the thermal oxidation method. Then, a polycrystalline silicon film 10 as a material for a floating gate electrode and a silicon oxide film 11 were deposited in sequence on the entire surface of the resulting substrate by the CVD method. Here, the silicon oxide 9, the polycrystalline silicon film 10 and the silicon oxide film 11 were deposited to be 15 nm, 250 nm and 50 nm, respectively, in thickness.

Figure 2A:
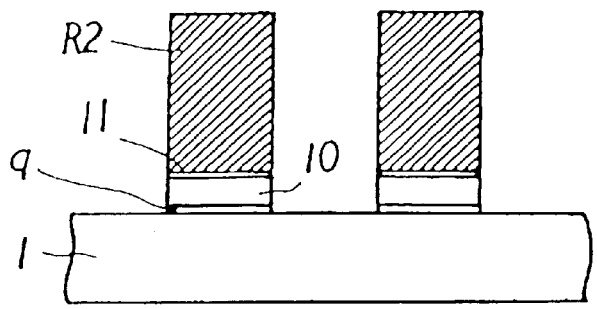

Then, as shown in FIG. 2(a), a resist R2 patterned for forming the floating gate electrode by the photolithography method was formed on the silicon oxide film 11. Then, using the resist R2 as a mask, a portion of the silicon oxide film 11, the polycrystalline silicon film 10 and the silicon oxide film 9 which the portion was to be the device isolation region was completely remove by the reactive ion etching method. As a result, the floating gate electrode of the polycrystalline silicon film 10 was formed.

Figure 2B:
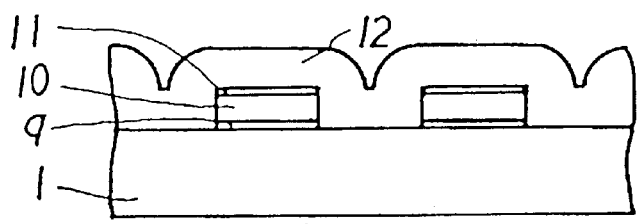

Then, after removing the resist R2, a polycrystalline silicon film 12 was deposited to be 200 nm in thickness on the entire surface of the resulting substrate by the CVD method as shown in FIG. 2(b).

Figure 2C:
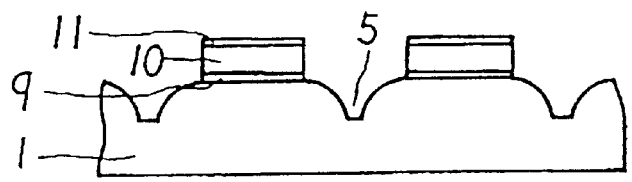

The polycrystalline silicon film 12 was etched by the reactive ion etching method until being completely removed. At this time, because the silicon substrate 1 was etched at substantially the same rate as the polycrystalline silicon film 12, the trench 5 having an arch-shaped sidewall were formed in the silicon substrate 1 as shown in FIG. 2(c).

Here, the reactive ion etching method was performed at a microwave power of 500 W and an RF power of 20 W with an etching gas of HBr (at a flow rate of 40 sccm) and $O_2$ (at a flow rate of 3 sccm) using the ECR etching apparatus of substrate bias type.

Figure 2D:
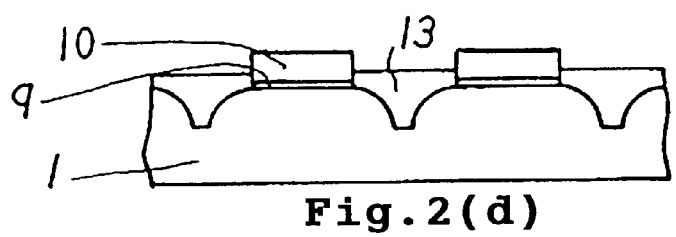

Then, a silicon oxide film of about 500 nm in thickness was deposited on the entire surface of the resulting substrate by the CVD method. The silicon oxide film was then flattened by the CMP method. Thus, the silicon oxide material (film) 13 was embedded in the trench 5 to form the device isolation region as shown in FIG. 2(d).

Figure 2E:
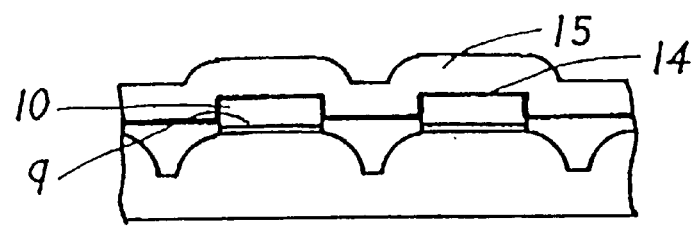
Figure 3A:
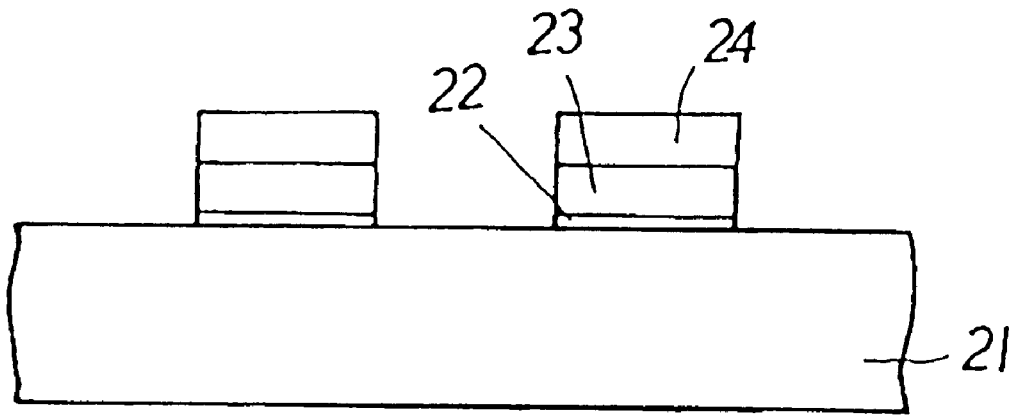
Figure 3B:
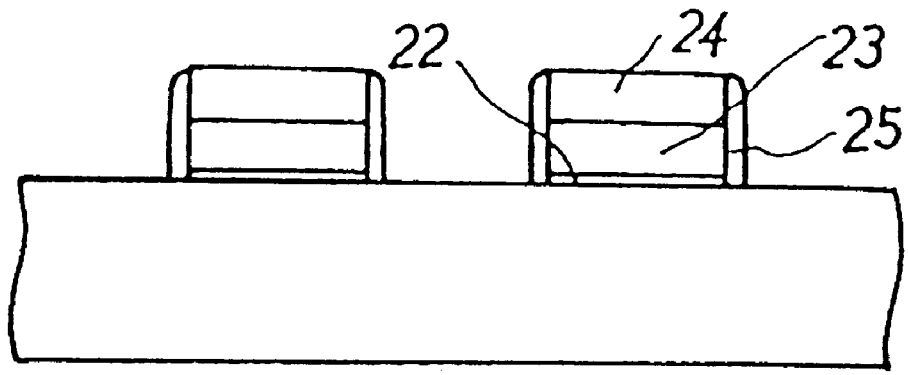
Figure 3C:
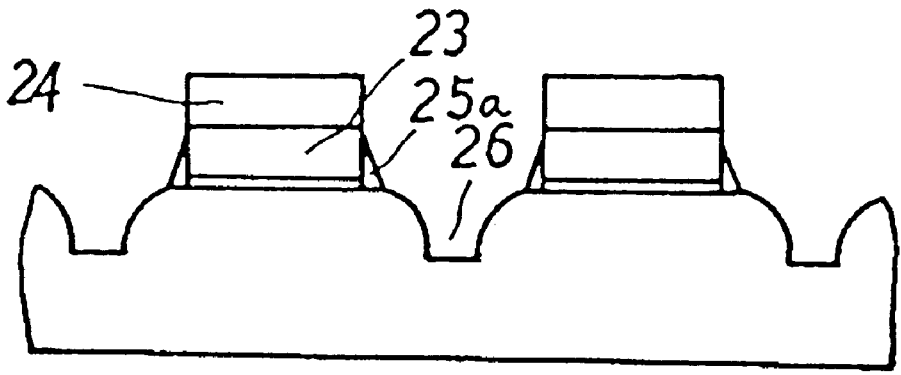

Subsequently, as shown in FIG. 2(e), a second gate insulating film 14 and a polycrystalline silicon film 15 as a material for forming a control gate was formed on the entire surface of the resulting substrate. Here, the second gate insulating film was formed in the form of a laminate film. The laminate film was composed of a silicon oxide film of 5 nm in thickness formed on the surface of the floating gate by thermal oxidation, a silicon nitride film of 5 nm in thickness formed thereon by the CVD method, and a silicon oxide film formed thereon by the CVD method. The polycrystalline film was formed to be 200 nm in thickness. Then, a resist (not shown) patterned for forming the control gate electrode was formed on the polycrystalline film 15. Using the resist as a mask, the polycrystalline silicon 15 was patterned to form the control gate electrode.

As described above, the present invention provides the following process for manufacturing a semiconductor device: the gate electrode or the dummy pattern is formed on the silicon substrate; then, the polycrystalline silicon film or the amorphous silicon film is deposited on the entire surface of the resulting silicon substrate; and then, the polycrystalline silicon film or the amorphous silicon film is completely removed by the anisotropic etching method. The Trench having the inclined sidewall can thus be formed on the silicon substrate. The trenches act to reduce electric field enhancement at end of the active region. Further, the void can be prevented from occurring during the step of embedding the insulating film for device isolation in the trench. Furthermore, since impurity ions can be implanted into the sidewall of the trench, the present invention is applicable to a semiconductor device having the connection of diffusion layers crossing the device isolation region.

According to the present invention, the formation of the inclined sidewall of the trench does not need any particular etching conditions. Therefore, the invention can avoid any damage to the silicon substrate due to high ion energy, which has been a problem involved in the conventional process. Further, because the present invention does not need a step of forming the sidewall spacer, the number of steps in the manufacture process can be decreased.

What is claimed is:

1. A process for manufacturing a semiconductor device comprising the steps of:

forming a mask having a pattern for forming a trench on a semiconductor substrate, wherein the mask is a laminate of a gate insulating film, a gate electrode and an insulating film in order from the semiconductor substrate;

forming a film having substantially the same etch rate as the semiconductor substrate on the resulting semiconductor substrate;

forming a trench having an inclined sidewall by simultaneously etching the film and a trench formation region on the semiconductor substrate;

embedding an insulating material in the trench to form a device isolation region;

removing the insulating film while flattening the device isolation region by chemical mechanical polishing; and forming a second gate insulating film and a control gate in a region on the semiconductor substrate.

2. The process according to claim 1, wherein the semiconductor substrate is a silicon substrate and the film is one of a polycrystalline silicon film and an amorphous silicon film.

3. The process according to claim 1, wherein said step of forming a trench having the inclined sidewall includes forming said trench to have said sidewall inclined in the shape of an arc.

4. The process according to claim 1 further comprising the step of flattening the device isolation region by chemical mechanical polishing after forming the device isolation region.

5. The process according to claim 1, wherein the etching is performed using an electron cyclotron resonance etching method.

* * * * *